United States Patent [19]

Kraemer

[11] 4,274,061

[45] Jun. 16, 1981

[54] REFERENCE VOLTAGE SOURCE, IN PARTICULAR FOR AMPLIFIER CIRCUITS

[75] Inventor: Horst Kraemer, Munich, Fed. Rep. of Germany

[73] Assignee: Siemens Aktiengesellschaft, Berlin & Munich, Fed. Rep. of Germany

[21] Appl. No.: 83,249

[22] Filed: Oct. 10, 1979

[30] Foreign Application Priority Data

Nov. 23, 1978 [DE] Fed. Rep. of Germany ....... 2850826

[51] Int. Cl.[3] ........................... H03F 3/04; H03F 3/45

[52] U.S. Cl. .................................... 330/296; 330/257; 330/261; 330/288; 330/289; 323/315

[58] Field of Search ............... 330/257, 261, 288, 289, 330/296, 297; 307/297; 323/4

[56] References Cited

U.S. PATENT DOCUMENTS 3,668,320 6/1972 Duck .................................. 179/1 A

FOREIGN PATENT DOCUMENTS 1763016 7/1971 Fed. Rep. of Germany .

2440023 3/1976 Fed. Rep. of Germany .

1307610 2/1973 United Kingdom .

1517246 7/1978 United Kingdom .

OTHER PUBLICATIONS

*Regelungstechnik,* No. 1, 1969, p. 13.

*Siemens Dajenbuch* 1974/1975, vol. 2, Linear Circuits, pp. 213, 214, 216.

Van Kessel et al., *Philips Technische Rundschan* 1971/1972, No. 1, pp. 4–8.

*Primary Examiner*—James B. Mullins

*Attorney, Agent, or Firm*—Hill, Van Santen, Steadman, Chiara & Simpson

[57] ABSTRACT

A reference voltage source, in particular for amplifier circuits, includes a pair of transistors having their bases connected together, one of the transistors being further connected as a diode and the other being operated normally. In the collector circuit of the transistors, a current mirror circuit is connected which includes a further transistor which is connected in series through an additional transistor to a reference potential. The base of the additional transistor is connected with emitter resistors in the emitter circuit of the first-mentioned transistors and the reference voltage is taken off at the connection between the serially connected further and additional transistors. Additional current mirror circuits may be employed for providing a symmetrical operation of the amplifier circuit supplied by the reference voltage source.

5 Claims, 1 Drawing Figure

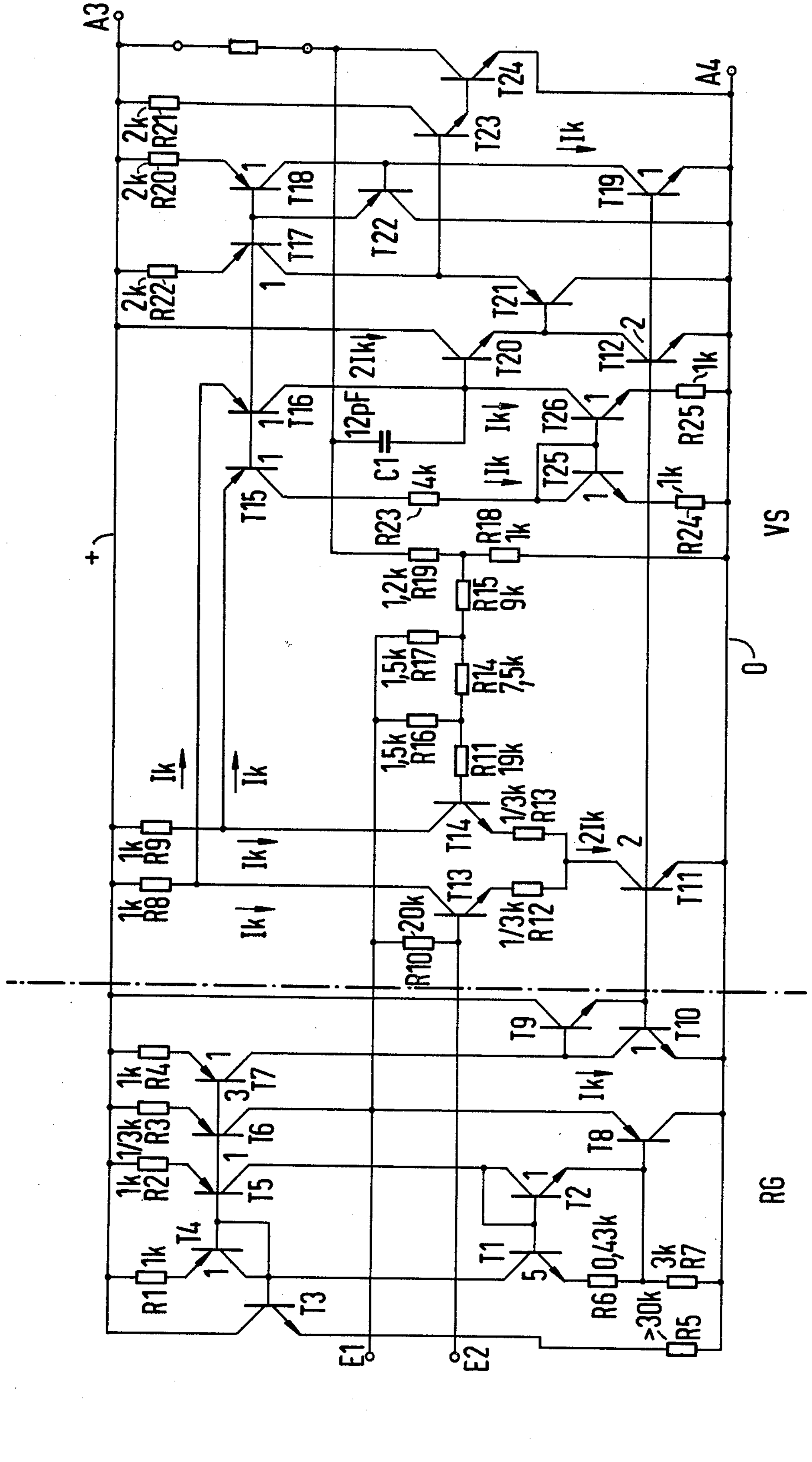
A3
A4
T24
T23
R21
2k
R20
T18
T19
T22
T17
R22
T21
T20
T12
T16
12pF
C1
T26
T25
R25
T15
R23
4k
R24
R18
1k
R19
1,2k
R15
9k
VS
R17
1,5k
R14
7,5k
R16
R11
19k
T14
R13
1/3k
R9
R8
T13
R12
R10
20k
T11
T9
T10
R4
R3
R2
R1
T7
T6
T5
T4
T3
T8
T2
T1
R6
0,43k
R7
3k
R5
>30k
E1
E2
RG
Ik
2Ik

REFERENCE VOLTAGE SOURCE, IN PARTICULAR FOR AMPLIFIER CIRCUITS

BACKGROUND OF THE INVENTION

1. Field of the Invention

This invention relates to a reference voltage source, and is more particularly concerned with a reference voltage source for amplifier circuits.

2. Description of the Prior Art

Many different variations of reference voltage sources are known in the art. In such sources, as is the usual case, the voltage drop at diode paths is utilized, for which also the base-emitter paths of transistors are used (see German Pat. No. 1,762,924 and German published application No. 1,763,016). Instead of diodes, transistors are used and the base-collector path is short circuited (see "Regelungstechnik" (Control Engineering), No. 1, 1969 p. 13 and Siemens Datenbuch (Siemens Data Book) 1974/1975, Vol. 2, "Linear Circuits", pp. 213–215). All of these reference voltage sources can be used, for example, for the stabilization of the operating points of amplifier circuits. Of particular concern are amplifier circuits which are constructed with differential amplifiers.

SUMMARY OF THE INVENTION

The object of the present invention is to improve the utility of such reference voltage sources. The improvement concerns, the particular, measures which assure that the reference voltage maintains its provided magnitude independently of the load. In achieving this object, one proceeds from a reference voltage source, in the case of which the reference voltage lies at the bases of two transistors which are connected with one another, of which one is connected as a diode, whereas the other is operated normally.

According to the present invention, a reference voltage source of this type is characterized in that in the collector circuit of the two transistors, a current mirror circuit is looped in, which includes a further transistor which is connected in series with the corresponding transistor which is placed at a reference potential, the base of which is connected with the emitter resistances of those transistors at the base of which the reference voltage is applied, and that the reference voltage is measured at the point of connection between the collector and the emitter of the transistors which are connected in series for a circuit which is being supplied thereby. In view of this, current mirror circuits come into question, as the same are known in the art from, for example, the German published application Nos. 2,44,023 and 2,642,874, Philips Technische Rundschau (Philips Technical Survey) 1971/72, No. 1, pp. 4–8, and Regelungstechnik (Control Engineering), No. 1, 1969, p. 13. Because the reference voltage is measured at a tap of the series circuit of the two pertaining transistors, a loading of the internal reference circuit point of the reference voltage source is avoided, even if the tap is utilized as a current source, or respectively, a current sink for the stabilization of the operating point of the circuit being supplied. A particularly high constancy of the reference voltage is thereby assured. It is also advantageous that the voltage requirement for the reference voltage source be very low. Its minimum operating voltage is at approximately the saturation voltage of a transistor (T6) via the reference voltage which is applied to the base of a transistor (T2). A practical further design of the reference voltage source results if an additional transistor is provided in the current mirror circuit to feed a further current mirror circuit, which has transistors which are looped into circuits of that which is being supplied with the reference voltage. By this means, in an easy manner, constant current effects are brought into existence for the circuit being supplied.

BRIEF DESCRIPTION OF THE DRAWING

Other objects, features and advantages of the invention, its organization, construction and operation will be best understood from the following detailed description, taken in conjunction with the accompanying drawing, on which there is a single FIGURE which is a schematic circuit diagram of a reference voltage source and a circuit supplied thereby constructed in accordance with the present invention.

DESCRIPTION OF THE PREFERRED EMBODIMENTS

The effects mentioned above will be explained in greater detail with reference to the reference voltage source and circuit supplied thereby illustrated on the drawing. On the drawing, the reference voltage source RG and the amplifier circuit VS are illustrated. The input of the amplifier circuit VS is provided by a pair of terminals E1 and E2. The output of the amplifier VS is provided at the terminals A3 and A4. In the case of this amplifier circuit, it is a matter of a microphone amplifier in which an acoustic/electric converter, in particular a piezoelectric ceramic, is connected at the input terminal E1 and E2. By way of thè output terminals A3 and A4, the operating voltage +/0 is supplied and the output signal is superposed thereon. The reference voltage which is supplied by the reference voltage source RG is applied to the input terminal E1. With its help, the operating point of the differential amplifier comprising a pair of transistors T13 and T14, which belong to the amplifier circuit, is stabilized.

The reference voltage source RG comprises a transistor T2 which is connected as a diode and a normally operated transistor T1. The bases of these two transistors are connected together and produce the internal reference voltage point. In the collector circuit of the transistors T1 and T2, a current mirror circuit is provided which comprises a pair of transistors T4 and T5 and a pair of resistors R1 and R2. The current mirror circuit also includes a transistor T6 with an emitter resistor R3 and a collector which is connected to the terminal E1 and to the emitter of a transistor T8, which has its collector connected to a reference potential 0. The base of the transistor T8 is connected to the emitter of the transistor T2 and to the tap of the series circuit of the emitter resistances R6 and R7 in the emitter circuits of the transistors T1 and T2. The point of connection between the collector of the transistor T6 and the emitter of the transistor T8 is connected, as mentioned above, with the input terminal E1. Therefore, the reference voltage for the circuit VS which is supplied thereto is measured at this point. The magnitude of the reference voltage is determined by the voltage which appears at the internal reference voltage point, namely at the connected bases of the transistors T1 and T2. It is nevertheless prevented, with the help of the output circuit formed by the transistors T8 and T6, that this internal reference voltage point becomes loaded by a measuring or taking off of the reference voltage. For providing the reference voltage, here the transistors T6 and T8, which belong to the output circuit, can function as a current source, or respectively, a current sink. A loading of the internal reference voltage point is avoided during operation.

The reference voltage source RG is supplemented also by the starting circuit which includes the series connection of the transistor T3 and its emitter resistor R5. The operating voltage +/0 is applied across the starting circuit T3, R5. The base of the transistor T3 is connected with the collector of the transistor T1. It is therefore assured that the reference voltage, upon the application of the operating voltage, adjusts itself at the internal reference circuit point.

In the case of the reference voltage source RG, the surface of the emitter of the transistor T2 which is connected as a diode, is a fraction of the surface of the emitter of the associated transistor T1. Hereby, and by means of the further circuit measures which are provided, there results a temperature compensation to the extent that the reference voltage which is desired is, to a large extent, independent of the temperature (see also Regelungstechnik (Control Engineering), No. 1,1969, p. 13 and the German allowed application No. 1,944,028, at column 1). In the case of the exemplary circuit illustrated on the drawing, the surface of the emitter of the transistor T1 is five times as large as the surface of the emitter of the transistor T2. This is indicated on the drawing also by means of the additional reference characters 5 and 1. In the case of the different resistances which belong to the circuit, the ohmic values have been provided on the drawing. For the temperature compensation, also the ratio of the emitter resistors R6 and R7 is important. It can also been seen with the symbols representing the transistors that it is a matter in each case of a pnp transistor or of a npn transistor.

As was already mentioned, an additional transistor also belongs to the current mirror circuit, this being the transistors T7 which has an emitter resistor R4 and which feeds a further current mirror circuit. This further current mirror circuit comprises the transistors T9, T10, T11, T12 and T19. The transistors T11, T12 and T19 are looped into the circuit of the amplifier VS which is supplied with the reference voltage. Therefore, the transistor T11 is connected in the emitter circuit of the differential amplifier which comprises the transistors T13 and T14, the emitter resistors R12 and R13, and the collector resistors R8 and R9. The transistor T12 is connected into the main circuit of the transistor T20, which belongs to an intermediate amplifier of the amplifier circuit VS. The transistor T19 is connected into a current branch of a current circuit which belongs to the amplifier circuit, and which comprises a plurality of transistors T17, T18 and T22 and a pair of resistors R20 and R22. By means of this circuit technology, a certain current feed is desired for the amplifier circuit, for which a circuit structure is employed which can easily be added onto the circuit structure belonging to the reference voltage source. Also, in the case of the transistors which come under consideration for this purpose, in each case the size of the associated emitter surfaces is indicated by means of reference symbols applied to the drawing. Therefore, in the case of the transistors T7, T10 and T19, the reference symbol 1 is provided, whereas, in the case of the transistors T11 and T12, the reference symbol 2 is applied. In accordance with this, the two transistors T11 and T12 carry a primary current which is twice as large as the other three transistors T7, T10 and T19. Also, in the case of the remaining transistors which are associated with the current mirror circuit of the reference voltage generator RG, namely the transistors T4, T5 and T6, the size of the emitter surface has been indicated on the drawing. In accordance with this, the transistor T6 has an emitter surface which is three times as large as the emitter surfaces of the transistors T1 and T5. The size of the currents which flow via the primary current paths of the transistors named above is stepped in accordance with the size of their emitter surfaces. Accordingly, also the size of the currents which flow in those circuits in which these transistors are connected is stepped in the same manner.

The amplifier circuit VS also comprises, in addition to the differential amplifier including the transistors T13 and T14, and the current mirror circuit having the transistor T17, T18 and T22, also already mentioned, a symmetrically connected transistor coupling stage with the transistors T15 and T16, by way of which the differential amplifier is connected with a two-stage intermediate amplifier having the transistors T20 and T21, onto which then as an output stage a Darlington amplifier is provided which includes a pair of transistors T23 and T24. The transistors T15 and T16 of the transistor coupling stage also belong to the current mirror circuit with the transistors T17 and T18. Thereby, and with the help of the additional current mirror circuit with the transistor T25 and T26 and the emitter resistors R24 and R25, as well as the current mirror circuit with the transistors T9, T10, T11, T12 and T19, the coupling stage and the input stage are adjusted symmetrically with respect to current. Thereby, a particularly stable operating manner is achieved for the amplifier. It is thereby also revealed that the amplifier characteristics are dependent to only a few small extent upon the feeding conditions of the circuit. Because of the very low voltage requirement of the amplifier circuit and because of the remaining favorable characteristics, there also results a very high level control capacity of the amplifier circuit. Between the output and the input, also the voltage feedback network with the resistor R19, R18, R17, R16, R14, R11 and R10 is included. With the help of the feedback circuit, among other things, the amplification factor of the amplifier circuit is determined (see also Siemens-Databuch (Siemens Data Book) 1974/74, Vol. 2, "Linear Circuits", pp. 213–215). During the stabilization, also in the feedback capacitor C1 participates. The transistors T23 and T24 of the output stage have, in each case, there own collector resistors R21 and RL. A particularly high level control capacity of the output level and a low saturation voltage of the transistor T24 results. Errors have been provided on the drawing and referenced Ik and 2Ik, which indicate the direction and magnitude of the current which flow in the appertaining current branches. These currents result, above all, because of the provision of the current mirror circuits.

The microphone amplifier which is set forth above is also designed with respect to circuit engineering such that it can be realized easily within an integrated circuit. Its advantageous characteristics thereby remain preserved.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A reference voltage source comprising:

first and second transistors each including a base, an emitter and a collector, said base of said second transistor connected to its collector and to said base of said first transistor;

a reference potential terminal and an operating voltage terminal;

first and second resistors connected in series between said emitter of said first transistor and said reference potential and including a junction therebetween connected to said emitter of said second transistor;

a current mirror circuit connected between said operating voltage terminal and said collectors of said first and second transistors, said current mirror circuit comprising a third transistor including an emitter-collector circuit connected to said operating voltage terminal; and a fourth transistor including an emitter-collector circuit connected in series with said emitter-collector circuit of said third transistor, and forming a tap therebetween, and connected to said reference voltage terminal, and a base connected to said emitter of said second transistor, said tap providing an output reference voltage for a circuit supplied by the reference voltage source.

2. The reference voltage source of claim 1, and further comprising:

a starting circuit including a third resistor and a fifth transistor having an emitter-collector circuit connected in series with said third resistor across said reference and operating potential terminals, and a base connected to said collector of said first transistor, and operable to cause automatic adjustment of the voltage at the bases of said first and second transistors upon the application of the operating and reference potentials.

3. The reference voltage source of claim 1, wherein for temperature compensation, said emitter of said second transistor has surface area which is a fraction of the surface area of said emitter of said first transistor.

4. The reference voltage source of claim 1, in combination with a circuit which is supplied with the output reference voltage, said circuit including a plurality of stages, and further comprising in said current mirror circuit a fifth transistor having an emittor-collector circuit connected to said operating voltage terminal, and a further current mirror circuit including sixth, seventh and a plurality of eighth transistors each having an emitter, a collector and a base with said bases of said seventh and eigth transistors connected together and to said emitter of said sixth transistor, said collector of said sixth transistor connected to said operating potential terminal, said base of said sixth transistor connected to said collector of said seventh transistor, the emitter-collector path of said seventh transistor connected between said emitter-collector path of said fifth transistor and said reference potential terminal, and the emitter-collector paths of said eighth transistors connected between respective ones of said stages and said reference potential terminal.

5. The reference voltage source of claim 4, wherein:

said eighth transistors of said further current mirror circuit comprise means for providing a stepped current pattern, said means including the sizes of the emitter surfaces.

* * * * *